US010002957B2

(12) United States Patent
Koudymov

(10) Patent No.: US 10,002,957 B2
(45) Date of Patent: Jun. 19, 2018

(54) SHIELD WRAP FOR A HETEROSTRUCTURE FIELD EFFECT TRANSISTOR

(75) Inventor: Alexei Koudymov, Troy, NY (US)

(73) Assignee: Power Integrations, Inc., San Jose, CA (US)

( * ) Notice: Subject to any disclaimer, the term of this patent is extended or adjusted under 35 U.S.C. 154(b) by 53 days.

(21) Appl. No.: 13/333,843

(22) Filed: Dec. 21, 2011

(65) Prior Publication Data

US 2013/0161692 A1    Jun. 27, 2013

(51) Int. Cl.
*H01L 29/66* (2006.01)
*H01L 29/778* (2006.01)
*H01L 29/20* (2006.01)

(52) U.S. Cl.
CPC ...... *H01L 29/7787* (2013.01); *H01L 29/2003* (2013.01)

(58) Field of Classification Search
CPC .......... H01L 29/2003; H01L 29/7787
USPC .......................... 257/192, E29.009
See application file for complete search history.

(56) References Cited

U.S. PATENT DOCUMENTS

| | | | | |
|---|---|---|---|---|
| 4,172,260 A * | 10/1979 | Okabe | ............ | H01L 29/7835 257/408 |
| 5,907,173 A * | 5/1999 | Kwon | ............ | H01L 29/402 257/336 |
| 6,127,703 A * | 10/2000 | Letavic | ............ | H01L 29/78624 257/344 |
| 7,075,125 B2 * | 7/2006 | Saito | ............ | H01L 29/7787 257/194 |
| 7,148,540 B2 * | 12/2006 | Shibib | ............ | H01L 29/402 257/336 |
| 7,304,331 B2 * | 12/2007 | Saito et al. | ............ | 257/192 |
| 7,355,215 B2 * | 4/2008 | Parikh | ............ | H01L 27/0605 257/192 |
| 7,388,236 B2 * | 6/2008 | Wu | ............ | H01L 29/7787 257/192 |

(Continued)

FOREIGN PATENT DOCUMENTS

| | | |
|---|---|---|
| CN | 101299437 A | 11/2008 |
| JP | 63-266854 A | 11/1988 |

(Continued)

OTHER PUBLICATIONS

European Search Report received for European Patent Application No. 12195320.2, dated May 23, 2013, 2 pages.

(Continued)

*Primary Examiner* — Jay C Kim
(74) *Attorney, Agent, or Firm* — Christensen O'Connor; Johnson Kindness PLLC

(57) ABSTRACT

Devices are disclosed for providing heterojunction field effect transistor (HFETs) having improved performance and/or reduced noise generation. A gate electrode is over a portion of the active region and is configured to modulate a conduction channel in the active region of an HFET. The active region is in a semiconductor film between a source electrode and a drain electrode. A first passivation film is over the active region. An encapsulation film is over the first passivation film. A first metal pattern on the encapsulation film includes a shield wrap over the majority of the active region and is electrically connected to the source electrode.

15 Claims, 4 Drawing Sheets

(56) References Cited

U.S. PATENT DOCUMENTS

| | | | | |
|---|---|---|---|---|
| 7,501,669 | B2* | 3/2009 | Parikh | H01L 29/402 257/192 |
| 7,508,015 | B2* | 3/2009 | Saito et al. | 257/192 |
| 7,566,913 | B2* | 7/2009 | Therrien | H01L 29/2003 257/103 |
| 7,573,078 | B2* | 8/2009 | Wu et al. | 257/194 |
| 7,576,387 | B2* | 8/2009 | Theeuwen | H01L 29/402 257/328 |
| 7,656,010 | B2* | 2/2010 | Murata | H01L 23/367 257/192 |
| 7,728,354 | B2* | 6/2010 | Saito et al. | 257/192 |
| 7,759,700 | B2* | 7/2010 | Ueno | H01L 23/3732 257/12 |
| 7,800,131 | B2* | 9/2010 | Miyamoto | H01L 29/404 257/192 |
| 7,855,401 | B2* | 12/2010 | Sheppard | H01L 21/045 257/192 |
| 7,898,047 | B2* | 3/2011 | Sheppard | H01L 21/8213 257/256 |
| 7,928,475 | B2* | 4/2011 | Parikh | H01L 29/812 257/194 |
| 7,952,145 | B2* | 5/2011 | Korec | H01L 29/41766 257/343 |
| 8,008,977 | B2* | 8/2011 | Tserng et al. | 330/311 |
| 8,039,301 | B2* | 10/2011 | Kub | H01L 29/1602 257/E21.041 |
| 8,154,079 | B2* | 4/2012 | Matsushita et al. | 257/343 |
| 8,237,196 | B2* | 8/2012 | Saito | 257/192 |
| 8,242,512 | B2* | 8/2012 | Yamaki | H01L 29/0657 257/77 |
| 8,288,796 | B2* | 10/2012 | Ito | H01L 29/1083 257/192 |
| 8,314,447 | B2* | 11/2012 | Hirler | H01L 29/0619 257/192 |
| 8,338,860 | B2* | 12/2012 | Bhalla | H01L 29/1029 257/192 |
| 8,368,121 | B2* | 2/2013 | Xin et al. | 257/195 |
| 8,384,129 | B2* | 2/2013 | Kub | H01L 29/0847 257/194 |
| 8,530,936 | B2* | 9/2013 | Ishii | H01L 29/404 257/192 |
| 8,530,937 | B2* | 9/2013 | Aoki | H01L 29/402 257/192 |
| 8,592,867 | B2* | 11/2013 | Wu | H01L 29/7787 257/194 |
| 8,624,265 | B2* | 1/2014 | Saito | 257/77 |
| 8,664,695 | B2 | 3/2014 | Wu et al. | |
| 8,692,324 | B2* | 4/2014 | Korec | H01L 29/41741 257/336 |
| 8,754,496 | B2* | 6/2014 | Tserng et al. | 257/488 |
| 8,772,832 | B2* | 7/2014 | Boutros | 257/194 |
| 8,829,999 | B2* | 9/2014 | Fisher | H01L 27/0605 330/307 |
| 9,093,512 | B2* | 7/2015 | Ohki | |
| 9,306,014 | B1* | 4/2016 | Kudymov | H01L 29/404 |
| 2005/0051796 | A1 | 3/2005 | Parikh et al. | |
| 2006/0011915 | A1 | 1/2006 | Saito et al. | |
| 2007/0045670 | A1* | 3/2007 | Kuraguchi | 257/249 |
| 2007/0235775 | A1* | 10/2007 | Wu | H01L 29/404 257/288 |
| 2007/0241368 | A1* | 10/2007 | Mil'shtein et al. | H01L 29/42316 257/192 |
| 2007/0249119 | A1* | 10/2007 | Saito | 438/253 |
| 2007/0272957 | A1* | 11/2007 | Johnson et al. | 257/289 |
| 2008/0073670 | A1* | 3/2008 | Yang et al. | 257/194 |
| 2008/0128753 | A1* | 6/2008 | Parikh | H01L 29/7787 257/194 |
| 2009/0256210 | A1* | 10/2009 | Matsushita et al. | 257/379 |
| 2009/0267116 | A1 | 10/2009 | Wu et al. | |
| 2010/0314666 | A1 | 12/2010 | Saito et al. | |
| 2013/0099284 | A1* | 4/2013 | Tserng | H01L 29/402 257/194 |
| 2013/0146943 | A1 | 6/2013 | Edwards et al. | |

FOREIGN PATENT DOCUMENTS

| | | |
|---|---|---|
| JP | H 05-055380 A | 3/1993 |
| JP | H0555380 A | 3/1993 |
| JP | H05152291 A | 6/1993 |
| JP | H 08-330519 A | 12/1996 |
| JP | H08330519 A | 12/1996 |
| JP | 2006-032552 A | 2/2006 |
| JP | 2007-095965 A | 4/2007 |
| JP | 2007-537594 A | 12/2007 |

OTHER PUBLICATIONS

Office Action received for European Patent Application No. 12195320.2 dated Jun. 3, 2013, 5 pages.

Office Action Received for Chinese Patent Application No. 201210552008.X, dated Mar. 23, 2015, 20 pages (10 pages of English Translation and 10 pages of Official Copy).

Office Action Received for Taiwan Patent Application No. 101148577, dated Nov. 20, 2014, 14 pages (7 pages of English Translation and 7 pages of Official Copy).

CN Patent Application No. 201210552008.X—Chinese Office Action, dated Oct. 12, 2015, with Machine English Translation, 10 pages.

CN Patent Application No. 201210552008.X—Chinese Office Action, dated Apr. 5, 2016, with Machine English Translation, 10 pages.

JP Patent Application No. 2012-278136—Japanese Office Action and Search Report, with English Machine Translation, dated Oct. 4, 2016, 9 pages.

Japanese Office Action and Translation dated Jun. 6, 2017, for Japanese Application No. 2012-278136, 7 pages.

Japanese Office Action and Translation dated Feb. 6, 2018, for Japanese Application No. 2012-278136, 8 pages.

* cited by examiner

SHIELD WRAP FOR A HETEROSTRUCTURE FIELD EFFECT TRANSISTOR

FIELD

The present disclosure relates generally to heterostructure field effect transistors (HFETs), and, more specifically, the present disclosure relates to a shield wrap for HFETs.

BACKGROUND

Many electrical devices such as cell phones, personal digital assistants (PDAs), laptops, etc., utilize power to operate. Because power is generally delivered through a wall socket as high-voltage alternating current (AC), a device, typically referred to as a power converter, can be utilized to transform the high-voltage AC input to a well-regulated direct current (DC) output through an energy transfer element. Switched-mode power converters are commonly used to improve efficiency and size and reduce component count in many of today's electronics. A switched-mode power converter may use a power switch that switches between a closed position (ON state) and an open position (OFF state) to transfer energy from an input to an output of the power converter. Typically, power switches are high-voltage devices required to withstand voltages substantially greater than the AC input voltage.

One type of high-voltage field effect transistor (FET) used in switched-mode power converters is the HFET, also referred to as a high-electron mobility transistor (HEMT). HFETs may be used as switches in switching devices for high-voltage power electronics, such as power converters. In certain applications, HFETs based on wide-bandgap semiconductors may be useful because the higher bandgap may improve performance at elevated temperatures. Examples of wide-bandgap semiconductors used in high-voltage HFETs include materials such as silicon carbide (SiC), gallium nitride (GaN), and diamond, although other materials may be used as well.

BRIEF DESCRIPTION OF THE FIGURES

Various aspects, features, and advantages of several embodiments of the present invention will be more apparent from the following more particular description thereof, presented in conjunction with the following drawings.

Non-limiting and non-exhaustive embodiments of the present invention are described with reference to the following Figures, wherein like reference numerals refer to like parts throughout the various views unless otherwise specified.

DETAILED DESCRIPTION

Figure 1:
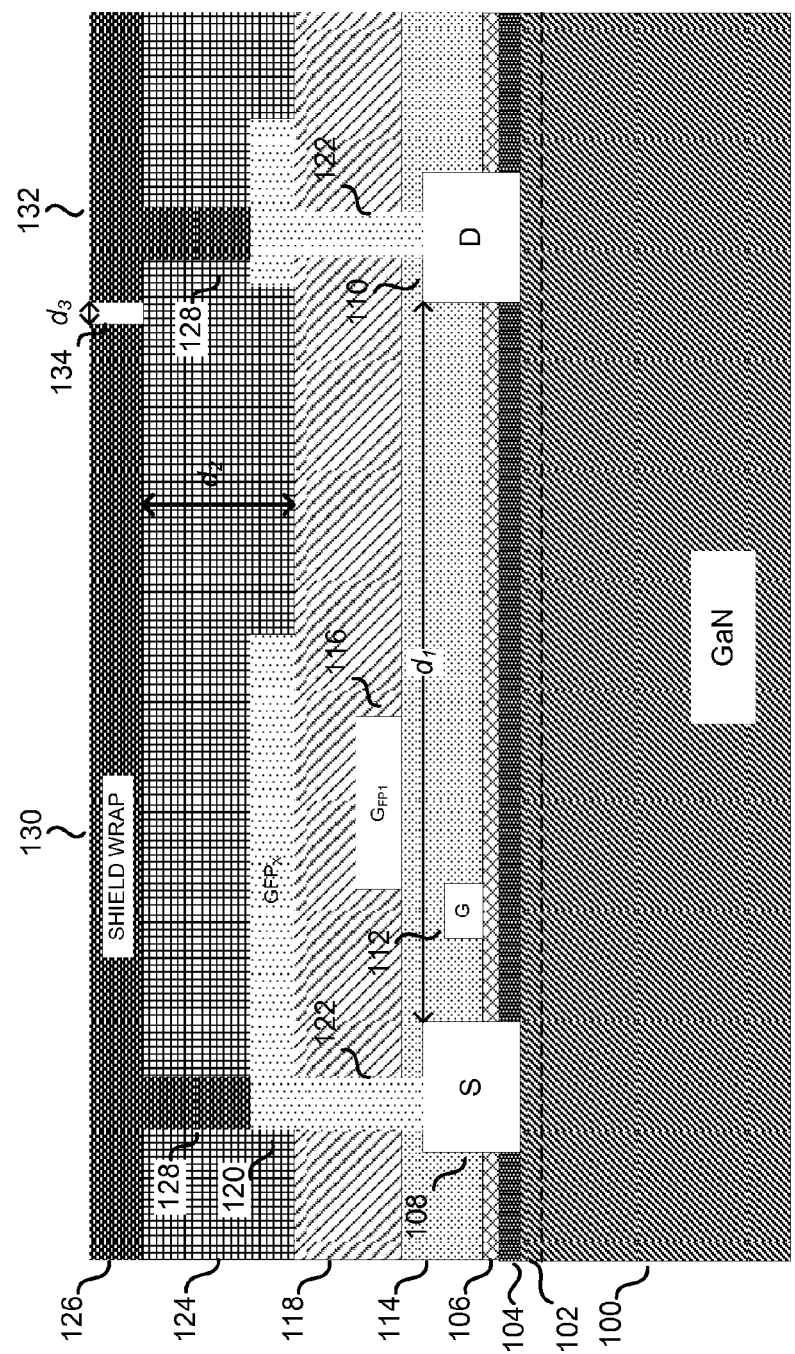
FIG. 1 illustrates an example HFET with a shield wrap according to an embodiment of the present invention.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example," or "an example" means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures, or characteristics may be combined in any suitable combinations and/or subcombinations in one or more embodiments or examples. Particular features, structures, or characteristics may be included in an integrated circuit, an electronic circuit, a combinational logic circuit, or other suitable components that provide the described functionality. In addition, it is appreciated that the Figures provided herewith are for explanation purposes to persons ordinarily skilled in the art and that the drawings are not necessarily drawn to scale.

In the description below, an example FET is used for the purposes of explanation. The example FET is referred to as an HFET despite the FET having a gate dielectric. In this respect, the example FET could also be called a metal insulator semiconductor FET (MISFET). Alternatively, the example FET could also be called a HEMT. For ease of explanation, however, the term HFET is used. It should be understood that use of these terms below are not limiting on the claims.

As used in this application, an electrical connection is an ohmic connection. For example, two metal patterns that contact each through only metal are electrically connected. In contrast, the drain and source electrodes are not electrically connected because any connection between these electrodes is through a channel in the semiconductor and controlled by the gate electrode. Similarly, the gate electrode is not electrically connected to the semiconductor under the gate electrode when a gate dielectric is used to insulate the gate electrode from the semiconductor beneath.

The operation of an HFET as a high-voltage switch involves ultra-fast (sub-microsecond) switching of the voltages of several hundreds volts. Such fast switching may generate large electromagnetic fields both near and far from the active region of the device. The frequency of these fields may be near the operating frequency of the HFET (e.g., in the kHz to MHz range). However, the channel of the HFET may experience local electromagnetic fields with much higher frequencies due to channel non-uniformities. These higher-frequency local fields may interact with contacts, pads, and metallization to emit in the GHz to THz range. Any of these large fields can be damaging and/or cause interference to surrounding circuits and even nearby electronic devices. The fields may also lead to long-term degradation and decreasing of the lifetime of packaging materials, interconnects, and dielectric layers exposed to the fields.

FIG. 1 illustrates an example semiconductor device including an example HFET using an example shield wrap according to an embodiment of the present invention. The example HFET is formed on a substrate (omitted from FIG. 1 for simplicity). On the substrate, a buffer layer 100 is formed as a GaN film. Another semiconductor film 102 is placed over the surface of buffer layer 100 to form a heterostructure with buffer layer 100. Semiconductor film 102 creates a conduction channel at the top portion of buffer layer 100. For example, semiconductor film 102 may be AlGaN. In other example FETs (not shown, including non-heterostructure FETs), semiconductor film 102 may be other materials, may be omitted, or may be the same material as buffer layer 100. Similarly, in other example FETs (not shown), buffer layer 100 may be made of other materials, such as silicon, gallium arsenide (GaAs), indium phosphide (InP), SiC, and the like. In some cases, buffer layer 100 and/or semiconductor film 102 may be a composite film made of layers of multiple films.

A passivation film 104 is formed over semiconductor film 102. Passivation film 104 may form a portion of the gate dielectric and may be grown as a high-quality insulating material. For example, passivation film 104 may be made of materials such as $Al_2O_3$, zirconium dioxide ($ZrO_2$), aluminum nitride (AlN), hafnium oxide ($HfO_2$), silicon dioxide ($SiO_2$), silicon nitride ($Si_3N_4$), or other suitable gate dielectric materials. Passivation film 104 may also form a high-quality interface with semiconductor film 102, which may improve reliability and increase surface mobility of electrons, thereby improving device performance.

Passivation film 104 may be formed as a low-defect/low-trap density film, which allows for improved gate dielectric reliability by minimizing the probability that hot carriers may be injected and/or trapped in passivation film 104. For example, an atomic layer deposition (ALD) may be used to form a high-quality material to serve as passivation film 104.

A passivation film 106 is formed over passivation film 104. Like passivation film 104, passivation film 106 may also form a portion of the gate dielectric. Passivation film 106 may be formed in a similar manner as and with materials similar to those of passivation film 104. For example, an in situ ALD process may be used to form both passivation films 104 and 106 in the same ALD tool without exposing the substrate to the environment outside of the tool. The combined thickness of passivation film 104 and 106 may be, for example, from 5 nm-20 nm. For a more detailed explanation of a process for forming these films, see U.S. patent application Ser. No. 13/323,672, titled IN SITU GROWN GATE DIELECTRIC AND FIELD PLATE DIELECTRIC, filed Dec. 12, 2011, assigned to the same assignee of this application, and incorporated by reference in its entirety herewith for all purposes. Shield wraps according to embodiments of the present invention may equally apply to the FETs disclosed in that application. In other example FETs, only a single passivation film (e.g., passivation film 104) is used.

A source electrode 108 and a drain electrode 110 are formed on semiconductor film 102. In other example HFETs, these electrodes may also contact buffer layer 100 under semiconductor film 102. The area between source electrode 108 and drain electrode 110 forms an active region where a conduction channel may form and may be controlled by gate electrode 112, which is formed on top of passivation film 106. In other example FETs, gate electrode 112 may be formed directly on semiconductor film 102. Gate electrode 112 is configured to modulate the conduction channel in the active region. In other words, by changing the voltage on gate electrode 112, conduction through the channel in the active region may be controlled. The metal stack for these electrodes may include, for example, Al, Ni, Ti, TiW, TiN, TiAu, TiAlMoAu, TiAlNiAu, TiAlPtAu, or the like. Other conductive materials besides metals may also be used.

A passivation film 114 is formed over source electrode 108, drain electrode 110, and gate electrode 112 to allow for formation of interconnects to the electrodes, one or more field plates (if being used), and a shield wrap. Passivation film 114 may be made of insulating materials such as silicon nitride, silicon oxide, and the like. In some cases passivation film 114 may be a composite film of multiple layers of different films.

A gate field plate 116 is formed on top of passivation film 114. Gate field plate 116 is designed to spread the electrical field on the edge of gate electrode 112 closest to drain electrode 110. Spreading the electric field in this region of the HFET may reduce the probability that carriers may be injected into the gate dielectric (passivation layers 104 and 106) and may help improve the reliability of the HFET. In other example HFETs, gate field plates may be omitted. Gate field plate 116 may be made from similar materials as the source, drain, or gate electrodes.

A passivation film 118 is formed over gate field plate 116. A metal pattern 120 may be formed over passivation film 118. Metal pattern 120 may include another gate field plate and vias 122 to make electrical contact to electrodes. In other example HFETs, only one gate field plate may be used or more than two gate field plates may be used.

An encapsulation film 124 is formed over metal pattern 120. Encapsulation film 124 may differ from passivation films 104, 106, 114, and 118 in that the defect/trap density of encapsulation film 124 is less important as compared to passivation films that are closer to semiconductor film 102. This allows encapsulation film 124 to be made of materials that may not be suitable for a passivation film. However, encapsulation film 124 may also be made from the same materials used for one or more of the passivation films. For example, encapsulation film 124 may be silicon oxide, silicon nitride, glass (e.g., frit-on glass), organic dielectrics (e.g., polyimide or benzocyclobutene based dielectrics), or the like. In some cases, encapsulation film 124 may be a composite film made of layers of multiple films. Encapsulation film 124 may be, for example, about 0.5 μm to 5 μm thick. In one example, encapsulation film 124 is 1 μm thick.

A metal pattern 126 is formed over encapsulation film 124. Metal pattern 126 includes shield wrap 130, a drain connection 132, and vias 128. Drain connection 132 makes electrical contact through one or more of vias 128 to drain electrode 110. Shield wrap 130 makes electrical contact through one or more of vias 128 to source electrode 108. In contrast to the field plates described above, shield wrap 130 may not be designed to spread the electric field. Instead, shield wrap 130 may contain electromagnetic radiation generated by the HFET. In other words, shield wrap 130 differs from a gate field plate in that shield wrap 130 covers as much of the HFET as possible. Thus, the geometry of shield wrap 130 may not be optimized for spreading the electric field on the edge of gate electrode 112 closest to drain electrode 110. In one example, shield wrap 130 may extend to overlap as much of the surface of the HFET as possible without creating a DC electrical path between source electrode 108 and drain electrode 110. By overlapping all of or a portion of the HFET, shield wrap 130 may reduce the electromagnetic radiation transmitted outside of the HFET as well as electromagnetic radiation reflected back to the HFET. To reduce the capacitive coupling between shield wrap 130 to the metal and semiconductor layers below shield wrap 130, the thickness, $d_2$, of encapsulation layer 124 may be increased.

A gap 134 defined in metal pattern 126 may be designed with a width, $d_3$, that is sufficiently wide so that shield wrap 130 will not short to drain connection 132 at high voltages.

For example, the active region between source electrode 108 and drain electrode 110 may have a width, $d_1$, that is about 1 µm per 100V of switching voltage for the HFET (e.g., a 500V HFET would have a $d_1$ of about 5 µm). In contrast, if gap 134 is filled with silicon nitride (SiN) (which may only require about 1 µm of SiN per 500-600V of switching voltage), the width, $d_3$, of gap 134 may be 5-6 times smaller or than $d_1$ (e.g., a 500V HFET would have a $d_3$ about 1 µm). In one case, $d_3$ is 15-20% of $d_1$. Metal pattern 126 may be, for example, about 0.7 µm to 2 µm thick.

Figure 2:
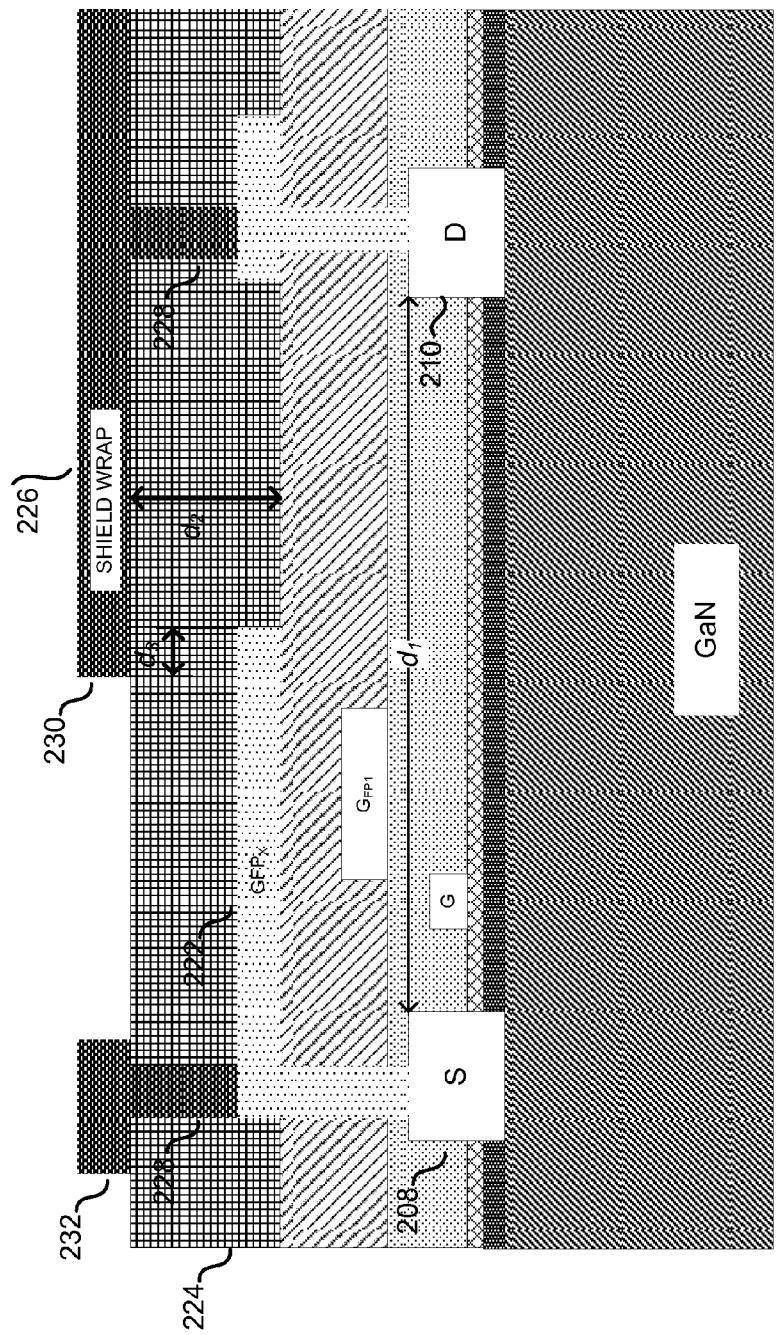
FIG. 2 illustrates another example HFET with a shield wrap.

FIG. 2 illustrates another example semiconductor device including an example HFET using an example shield wrap according to an embodiment of the present invention. As shown, a metal pattern 226 is formed over encapsulation film 224. Metal pattern 226 includes shield wrap 230, a source connection 232, and vias 228. Source connection 232 makes electrical contact through one or more of vias 228 to source electrode 208. Shield wrap 230 makes electrical contact through one or more of vias 228 to drain electrode 210. As shown, shield plate 230 may extend a distance $d_3$ past gate field plate 222. In one example, gate field plate 222 may also function as a portion of shield wrap 230 to maximize coverage of device surface.

Figure 3:
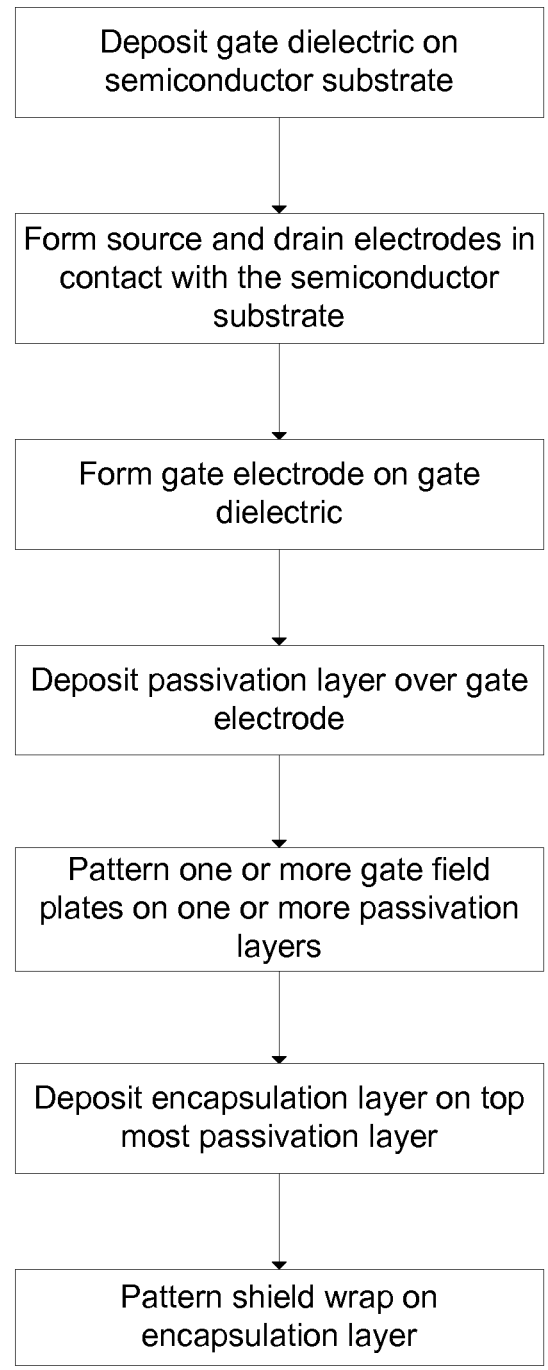
FIG. 3 illustrates a flowchart for an example process for creating an HFET with a shield wrap according to an embodiment of the present invention.

FIG. 3 illustrates a flow chart for an example process for making an example HFET having an example shield wrap according to an embodiment of the present invention. While various processing steps are included in the flow chart, it should be understood that other processing steps may be required to fabricate an example HFET with an example shield wrap according to an embodiment of the present invention. In other example processes, the steps shown in FIG. 3 may be performed in a different order or steps may be combined. For example, the gate electrode and a gate field plate may be formed at the same time. In still other example processes, some steps may be omitted. For example, an example process could omit the formation of the gate field plates if an HFET without gate field plates is desired.

Figure 4:
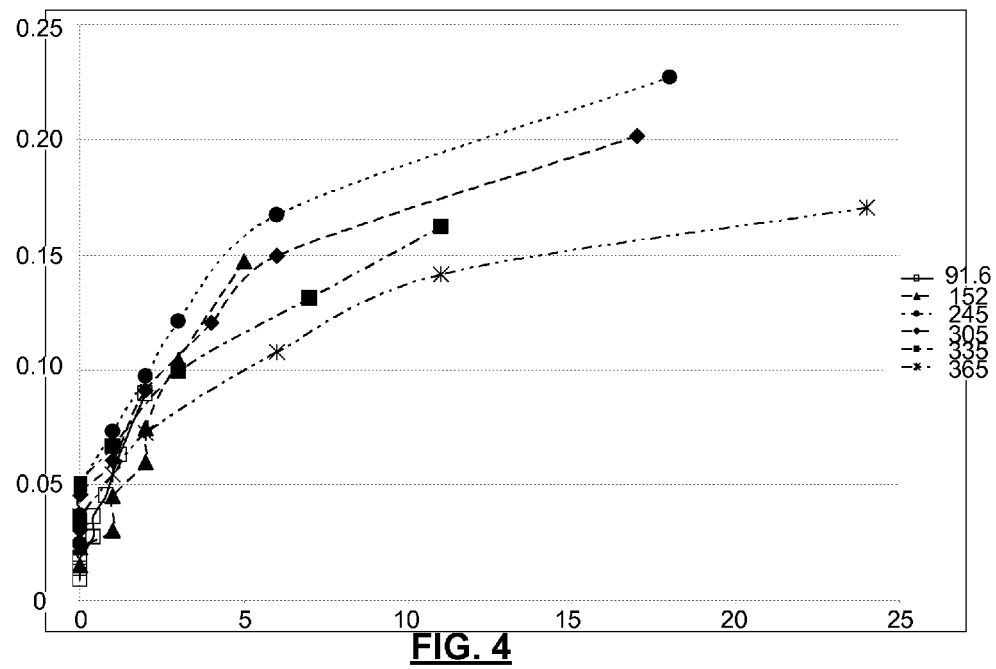
FIG. 4 illustrates electrical results for an example HFET without a shield wrap according to an embodiment of the present invention.
Figure 5:
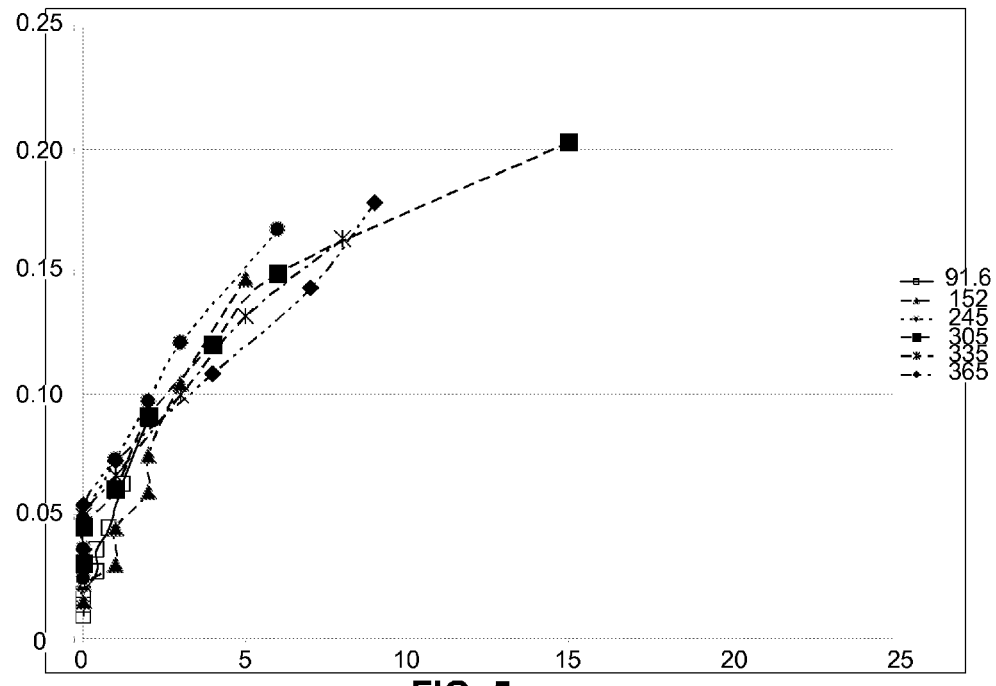
FIG. 5 illustrates electrical results for an example HFET with a shield wrap according to an embodiment of the present invention.

FIGS. 4 and 5 depict experimental results for example HFETS without (FIG. 4) and with (FIG. 5) a shield wrap according to an embodiment of the present invention. In particular, FIGS. 4 and 5 depict I-V characteristics of an HFET with and without a shield wrap. The results were obtained by pulsing an HEMT between the off state (gate bias=−10V) and the on state (gate bias=0V). The drain bias was set to various values as showing the legends of FIGS. 4 and 5. The pulsing was performed with a 10 ms period and 0.1% duty cycle. The total gate width was about 450 µm. The x-axis of FIGS. 4 and 5 are the instant drain voltage with the instant drain current on the y-axis.

As is evident by comparing the results in FIG. 4 (corresponding to the HFET without a shield wrap) to the results in FIG. 5 (corresponding to the HFET with a shield wrap according to an embodiment of the present invention), the distribution of instant drain current is more confined for the HFET with the shield wrap. A more confined distribution corresponds to an HFET with less degradation and better performance at higher drain voltages. Specifically, FIG. 4 shows that there is no distortion for drain voltages below 335V for the example HFET without a shield wrap, and FIG. 5 shows that there is not distortion for drain voltages below 365V for the example HFET with a shield wrap according to an embodiment of the present invention.

The above description of illustrated examples of the present invention, including what is described in the Abstract, are not intended to be exhaustive or to be limitations to the precise forms disclosed. While specific embodiments of, and examples for, the invention are described herein for illustrative purposes, various equivalent modifications are possible without departing from the broader spirit and scope of the present invention. Indeed, it is appreciated that the specific examples of thicknesses, materials, processing operations, etc., are provided for explanation purposes, and that other thicknesses, materials, processing operations, etc. may also be employed in other embodiments, examples, and processes in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and Figures are accordingly to be regarded as illustrative rather than restrictive.

The invention claimed is:

1. A high-voltage field effect transistor (HFET), comprising:
   a substrate;
   a GaN film buffer layer formed on the substrate;
   an AlGaN film disposed over a surface of the GaN film buffer layer to form a heterostructure with the GaN film buffer layer;
   a conduction channel formed at a top portion of the GaN film buffer layer;
   a first passivation film formed over the AlGaN film to form an interface with the AlGaN film to increase surface mobility of electrons, wherein the first passivation film forms a first portion of a gate dielectric;
   a second passivation film formed over the first passivation film, wherein the second passivation film forms a second portion of the gate dielectric;
   a source electrode formed on the AlGaN film;
   a drain electrode formed on the AlGaN film;
   an active region defined between the source electrode and the drain electrode, wherein the conduction channel is formed in the active region;
   a gate electrode formed on top of the second passivation film, wherein the gate electrode is coupled to receive a gate voltage to modulate the conduction channel in the active region;
   a third passivation film formed over the source electrode, the drain electrode, and the gate electrode to allow for formation of interconnects to the source electrode and the drain electrode;
   a first gate field plate formed on top of the third passivation film to spread an electric field on an edge of the gate electrode closest to the drain electrode to reduce a probability that carriers are injected in the gate dielectric;
   a fourth passivation film formed over the first gate field plate;
   a first metal pattern formed over the fourth passivation film, wherein the first metal pattern further includes a second gate field plate;
   a first source via coupled to the first metal pattern to make electrical contact to the source electrode, wherein the second gate field plate extends over the fourth passivation film;
   a first drain via coupled to the first metal pattern to make electrical contact to the drain electrode;

an encapsulation film formed over the first metal pattern; and a second metal pattern formed over the encapsulation film, wherein the second metal pattern includes:
  a shield wrap disposed over the encapsulation film, wherein the shield wrap extends to overlap a surface of the HFET without creating a direct current electrical path between the source electrode and the drain electrode;
  a second source via electrically connecting the shield wrap to the source electrode;
  a drain connection;
  a second drain via electrically connecting the drain connection to the drain electrode; and
  a gap defined in the second metal pattern between the shield wrap and the drain connection.

2. The HFET of claim 1, wherein the first passivation film comprises $Al_2O_3$, zirconium dioxide ($ZrO_2$), aluminum nitride (AlN), or hafnium oxide ($HfO_2$).

3. The HFET of claim 1, wherein the first passivation film comprises silicon dioxide ($SiO_2$), or silicon nitride ($Si_3N_4$).

4. The HFET of claim 1, wherein a combined thickness of the first and second passivation films is 5 nm-20 nm.

5. The HFET of claim 1, wherein a metal stack for the source electrode, the drain electrode, and the gate electrode comprises Al, Ni, or Ti.

6. The HFET of claim 1, wherein a metal stack for the source electrode, the drain electrode, and the gate electrode comprises TiW, TiN, or TiAu.

7. The HFET of claim 1, wherein a metal stack for the source electrode, the drain electrode, and the gate electrode comprises TiAlMoAu, TiAlNiAu, or TiAlPtAu.

8. The HFET of claim 1, wherein the third passivation film comprises silicon nitride or silicon oxide.

9. The HFET of claim 1, wherein the third passivation film is a composite film made of layers of multiple films.

10. The HFET of claim 1, wherein the encapsulation film comprises silicon oxide, silicon nitride, or glass.

11. The HFET of claim 1, wherein the encapsulation film comprises organic dielectrics, polyimide, or benzocyclobutene based dielectrics.

12. The HFET of claim 1, wherein the encapsulation film is a composite film made of layers of multiple films.

13. The HFET of claim 1, wherein the encapsulation film is 0.5 μm to 5 μm thick.

14. The HFET of claim 1, wherein the gap is filled with SiN.

15. The HFET of claim 1, wherein the second metal pattern has a thickness of 0.7 μm to 2 μm.

* * * * *